(12) United States Patent
Okuyama et al.

(10) Patent No.: US 10,424,860 B2
(45) Date of Patent: Sep. 24, 2019

(54) ELECTRICAL CONNECTOR AND TEST METHOD FOR ELECTRICAL CONNECTOR

(71) Applicant: Hirose Electric Co., Ltd., Tokyo (JP)

(72) Inventors: Takeshi Okuyama, Tokyo (JP); Yosuke Takeuchi, Tokyo (JP)

(73) Assignee: HIROSE ELECTRIC CO., LTD., Tokyo (JP)

( * ) Notice: Subject to any disclaimer, the term of this patent is extended or adjusted under 35 U.S.C. 154(b) by 5 days.

(21) Appl. No.: 15/620,718

(22) Filed: Jun. 12, 2017

(65) Prior Publication Data

US 2017/0358885 A1 Dec. 14, 2017

(30) Foreign Application Priority Data

Jun. 13, 2016 (JP) .................................. 2016-116826

(51) Int. Cl.
| | |
|---|---|
| *H01R 13/41* | (2006.01) |
| *G01R 31/04* | (2006.01) |
| *H01R 31/08* | (2006.01) |
| *H01R 13/6471* | (2011.01) |
| *H01R 12/73* | (2011.01) |

(52) U.S. Cl.
CPC ............ *H01R 13/41* (2013.01); *G01R 31/04* (2013.01); *H01R 31/08* (2013.01); *H01R 12/73* (2013.01); *H01R 13/6471* (2013.01)

(58) Field of Classification Search
CPC ........ H01R 13/41; H01R 31/08; H01R 12/73; H01R 13/6471; G01R 31/04
See application file for complete search history.

(56) References Cited

U.S. PATENT DOCUMENTS

| 7,731,537 B2* | 6/2010 | Amleshi | H01R 13/514 439/607.05 |
| 9,124,051 B2* | 9/2015 | Tanaka | H01R 24/76 |
| 2005/0099186 A1* | 5/2005 | Parker | G01R 31/04 324/538 |
| 2010/0210124 A1* | 8/2010 | Li | H01R 12/707 439/108 |

(Continued)

FOREIGN PATENT DOCUMENTS

JP 5820858 B2 11/2015

*Primary Examiner* — Akm Zakaria (74) *Attorney, Agent, or Firm* — Procopio, Cory, Hargreaves & Savitch LLP (57) ABSTRACT

Example implementations involve an electrical connector and a test method of the electrical connector, wherein the electrical conduction condition between a ground member and a ground terminal can be easily confirmed while reliably contacting the ground member and ground terminal. Electrical connector involves a plurality of terminals including two types of terminals, namely, signal terminals and ground terminals; a retaining body, made of an insulating material, that arranges and retains the plurality of terminals in a condition where the signal terminals and ground terminals are intermingled; and a ground member retained by the retaining body on the inward side of the retaining body, in a condition contacting at least two ground terminals; wherein the ground member has a detecting part exposed from the retaining body in order to detect an electrical conduction condition between the ground terminals and the ground member.

2 Claims, 8 Drawing Sheets

(56) References Cited

U.S. PATENT DOCUMENTS

| | | | | |
|---|---|---|---|---|
| 2013/0337685 A1* | 12/2013 | Hsu | ................ | H01R 13/658 |
| | | | | 439/607.01 |
| 2016/0172804 A1* | 6/2016 | Wu | ................ | H01R 24/60 |
| | | | | 439/676 |

* cited by examiner

ELECTRICAL CONNECTOR AND TEST METHOD FOR ELECTRICAL CONNECTOR

CROSS REFERENCE TO RELATED APPLICATIONS

This Paris Convention patent application claims benefit under 35 U.S.C. § 119 and claims priority to Japanese Patent Application No. JP 2016-116826, filed on Jun. 13, 2016, titled "ELECTRICAL CONNECTOR AND TEST METHOD FOR ELECTRICAL CONNECTOR", the content of which is incorporated herein in its entirety by reference for all purposes.

BACKGROUND

Technical Field

The present invention relates to an electrical connector having a ground member and to a test method for the electrical connector.

Background Art

The electrical connector of Patent Document 1, for example, is known as an electrical connector having a ground member. In the electrical connector of the Patent Document 1, a plurality of strip-shaped terminals (signal terminals and ground terminals) are arranged on a plurality of arranged plate-shaped blades, and the plurality of blades are arranged in a plate thickness direction of the blades. Each blade is integrally arranged and retained by a plate-shaped base material made of an insulating material in a condition where the signal terminals and ground terminals are intermingled, and both ends of each terminal are connected to a different mating connector. Note that a ground plate is attached to each plate surface of the base material of each blade so as to cover a terminal arrangement range, and the ground plate is retained by a plurality of retaining protruding parts provided as points on the plate surface of the base material. Each ground plate has a contact protruding part that is protruding in a plate thickness direction of the ground plate at a position corresponding to the ground terminals in a terminal arrangement direction, and is in contact with the ground terminal by the contact protruding part. Furthermore, with each ground plate, most of the entire area of the plate surface on the opposite side as the attachment surface on the base material is exposed.

PRIOR ART DOCUMENTS

[Patent Document 1] Japanese Patent No. 5820858

SUMMARY

Problems to be Solved by the Invention

In order to obtain a good ground function by the ground member, it is necessary that the contact condition between the ground member and the ground terminal be reliably maintained. In the electrical connector in Patent Document 1, as described above, the ground plate is only retained by the retaining protruding parts that are provided as points on the plate surface of the base material, and the retaining force is not very large, and therefore, there is a risk of manufacturing errors and installation errors of the members, inadvertent external forces, and the like causing the ground plate to be displaced in the plate thickness direction with regard to the base material, and this displacement leads to poor contact between the contact protruding parts of the ground plate and the ground terminals. Accordingly, preventing inadvertent displacement of the ground member is necessary by, for example, preferably retaining the ground member on the inward side of a retaining member that retains the terminal. However, if the ground member is provided on the inward side of the retaining member, confirming whether or not the ground member that is retained in the retaining member reliably contacts the ground terminal is difficult.

In view of the foregoing, an object of the present invention is to provide an electrical connector and a test method for an electrical connector, wherein the electrical conduction condition between a ground member and a ground terminal can be easily confirmed while reliably connecting the ground member and ground terminal.

Means for Solving the Problems

According to the present invention, the problem is resolved by the electrical connector according to the first invention and the test method of the electrical connector according to the second invention.

<First Invention>

The electrical connector according to the first invention is comprised by: a plurality of terminals including two types of terminals, namely, signal terminals and ground terminals; a retaining body, made of an insulating material, that arranges and retains the plurality of terminals in a condition where the signal terminals and ground terminals are intermingled; and a ground member retained by the retaining body on the inward side of the retaining body, in a condition contacting at least two ground terminals.

With the electrical connector of the first invention, the ground member has a detecting part that is exposed from a retaining body in order to detect an electrical conduction condition between the ground terminal and the ground member.

In the configuration of the first invention, the ground member is firmly retained by the retaining body, and is reliably in contact with the ground terminals by being positioned on the inward side of the retaining body in a condition contacting at least two ground terminals. The ground member firmly retained by the retaining body as described above is less likely to be displaced, and as a result, the contact condition of the ground member and the ground terminal is easily maintained. Furthermore, the ground member has a detecting part that is exposed from a retaining body in order to detect an electrical conduction condition between the ground terminal and the ground member. Therefore, the electrical conduction condition between the ground member and the ground terminal can be easily confirmed by performing a continuity test to confirm electrical conduction between the detecting part and the ground terminal.

In the first invention, a plurality of the ground members are provided, and the ground members may each contact different combinations of two ground terminals. When compared to providing one ground member, providing a plurality of ground members allows for each ground member to be smaller, thus making the retention of the ground members more reliable, and also makes it easier to correlate with the number of ground terminals.

In the first invention, the plurality of terminals have on one end a connecting part for connecting with a mating connecting member, and the connecting part of the terminals and detecting part of the ground member may protrude from the retaining body in the same direction.

<Second Invention>

The test method of an electrical connector according to the second invention detects the electrical conduction condition between a ground terminal and a ground member of the electrical connector, such that the electrical connector is comprised by: a plurality of terminals including two types of terminals, namely, signal terminals and ground terminals; a retaining body, made of an insulating material, that arranges and retains the plurality of terminals in a condition where the signal terminals and ground terminals are intermingled; and a ground member retained by the retaining body on the inward side of the retaining body in a condition contacting at least two ground terminals With the test method of the electrical connector of the second invention, an electrical current is provided to flow to the detecting part formed on the ground member and exposed from the retaining body and a predetermined ground terminal to detect the electrical conduction condition between the ground member and the predetermined ground terminal.

Effects of the Invention

As described above, in the present invention, the ground member is firmly retained by the retaining body on the inward side of the retaining body, and therefore, the ground member is less likely to be displaced, and the contact condition between the ground member and the ground terminal is easily maintained. Furthermore, the ground member has a detecting part exposed from the retaining body in order to detect the electrical conduction condition between the ground terminal and the ground member, and therefore, the electrical conduction condition between the ground member and the ground terminal can be easily confirmed by performing a continuity test of the detecting part and the ground terminal.

BRIEF DESCRIPTION OF THE DRAWINGS

FIG. 5(A) is a VA-VA cross-sectional view, FIG. 5(B) is a VB-VB cross-sectional view, and FIG. 5(C) is a VC-VC cross-sectional view.

FIG. 6(A) to 6(B) are diagrams illustrating the manufacturing process of the blade.

DETAILED DESCRIPTION

The embodiments of the present invention are described based on the attached drawings.

First Embodiment

Figure 1:
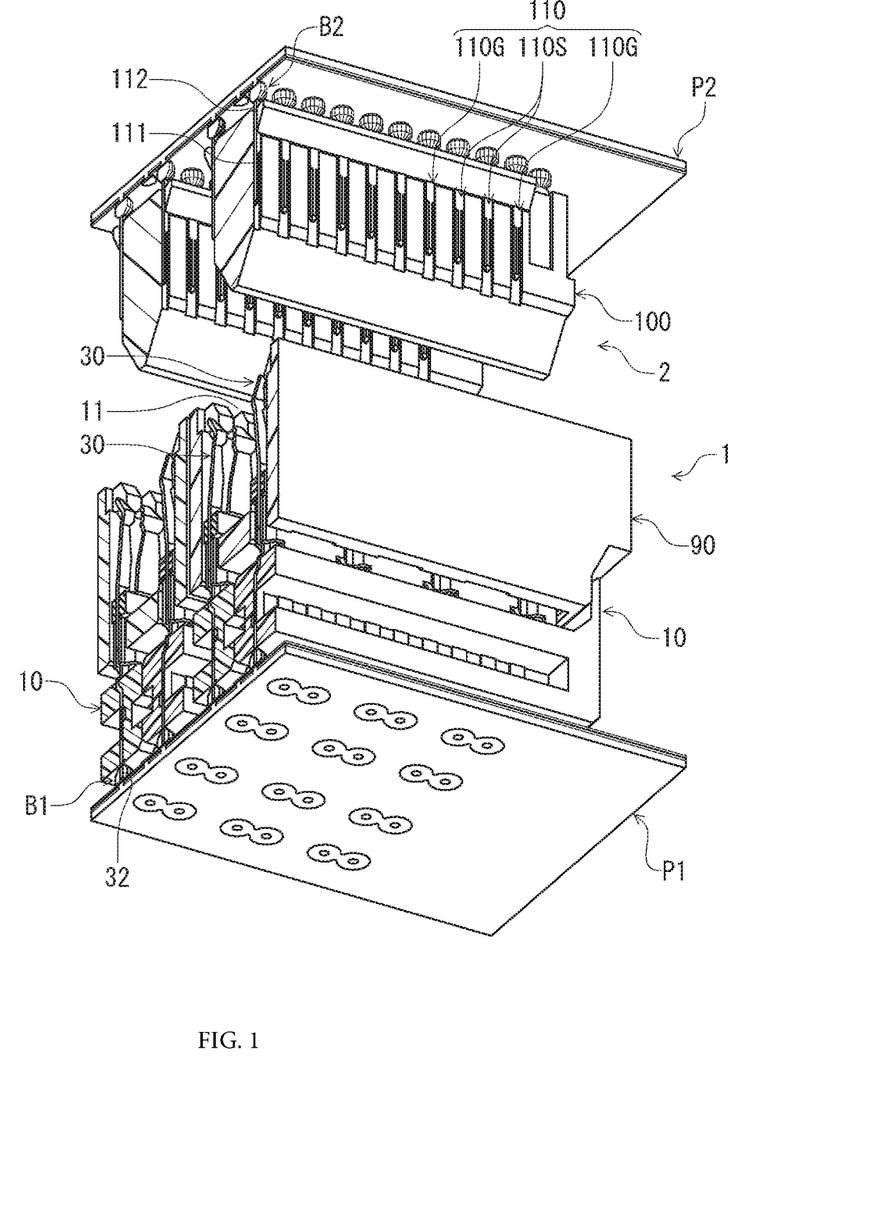
FIG. 1 is a cross-sectional perspective view illustrating an electrical connector along with a mating connector according to the first embodiment, and illustrates a condition before mating the connector.
Figure 2:
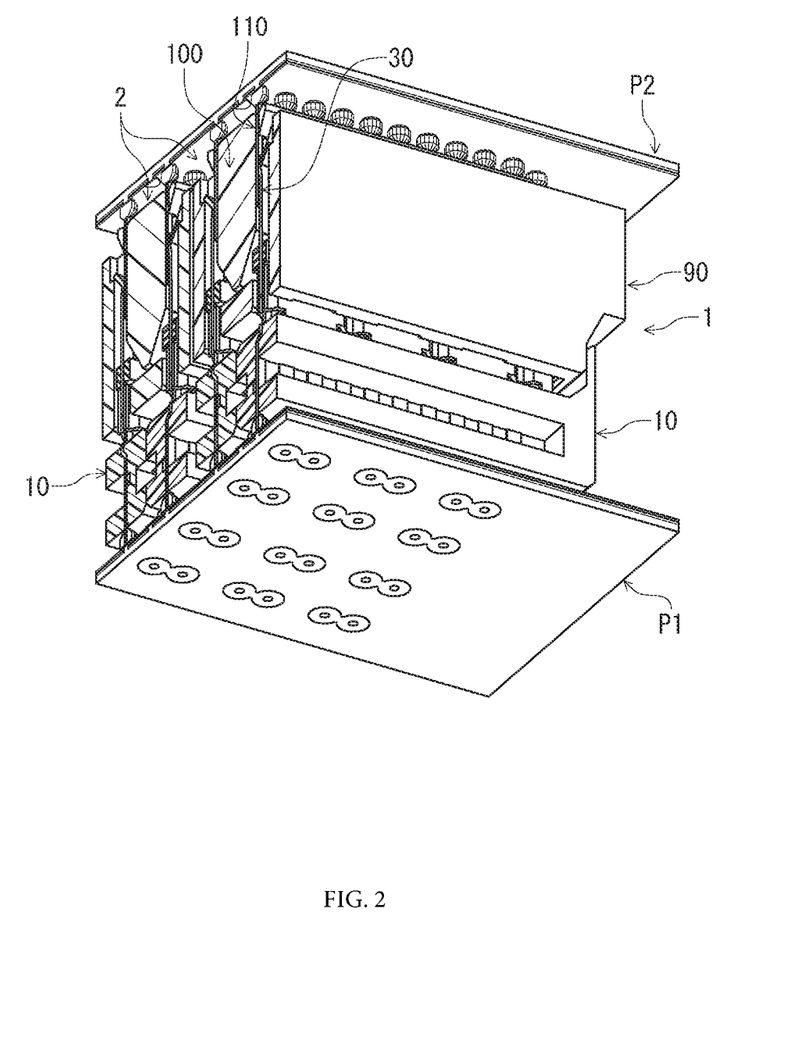
FIG. 2 is a cross-sectional perspective view illustrating a condition after both connectors in FIG. 1 are mated and connected.

FIG. 1 is a cross-sectional perspective view illustrating from below the electrical connector according to the first embodiment of the present invention along with the mating connector in a condition before connector mating. Furthermore, FIG. 2 is a cross-sectional perspective view illustrating a condition after both connectors in FIG. 1 are mated and connected. An electrical connector 1 (hereinafter referred to as "connector 1") according to the present embodiment is an electrical connector for a circuit board arranged on a mounting surface of a circuit board P1 as a mating connecting member, and a plurality of mating connectors 2 are connected from above. Furthermore, the mating connector 2 is an electrical connector for a circuit board provided on a mounting surface of a different circuit board P2. In the present embodiment, the connector 1 has a plurality of connecting bodies 10 which are described later, and one mating connector 2 is connected to one connecting body 10. Of the plurality of connecting bodies 10, two connecting bodies 10 and the mating connectors 2 that are connected to each of the connecting bodies 10 are illustrated in FIGS. 1, 2.

The connector 1 has a plurality of connecting bodies 10 that are connected to the mating connectors 2 and two supporting bodies (not illustrated) where the plurality of connecting bodies 10 are arranged and supported in a bundle. The plurality of connecting bodies 10 are arranged adjacent to each other in one direction parallel to the surface of the circuit board.

Figure 3A:
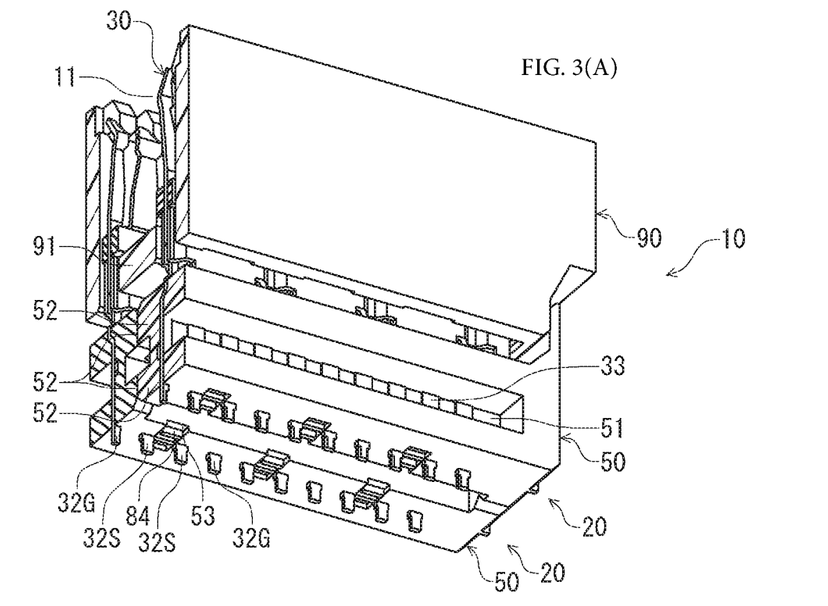
FIG. 3(A) is a cross-sectional perspective view illustrating a connecting body that is one of the electrical connectors in FIG. 1.
Figure 3B:
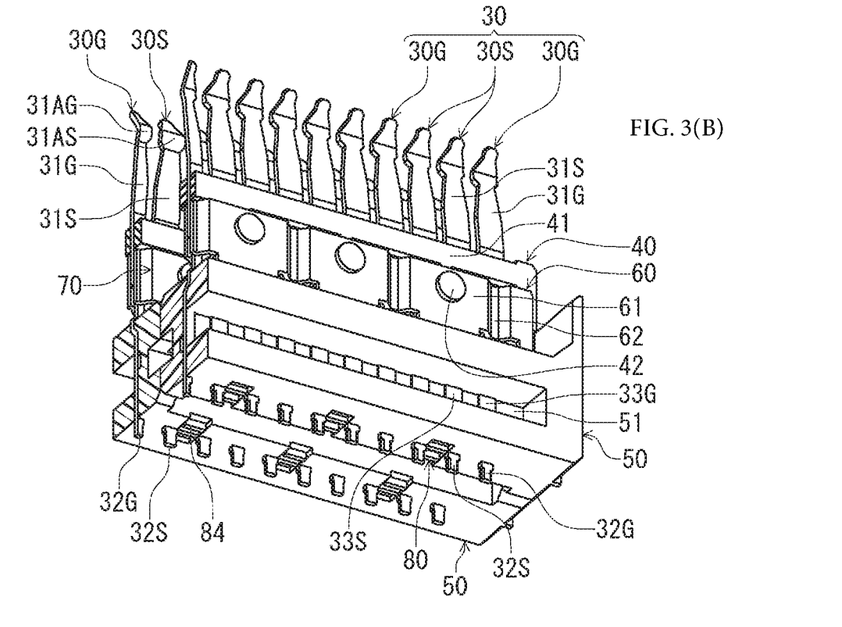
FIG. 3(B) is a cross-sectional perspective view illustrating a connecting body of FIG. 3(A), omitting the housing.

FIG. 3(A) is a cross-sectional perspective view illustrating one of the connecting bodies 10 of the electrical connector in FIG. 1, and FIG. 3(B) is a cross-sectional perspective view illustrating a connecting body 10 of FIG. 3(A), omitting the housing 90. As seen in FIG. 3(A), the connecting body 10 has: two blades 20 that form a pair, formed in the same mutual shape, and arranged to face each other so as to be symmetrical in an arrangement direction of the connecting body 10; and a housing 90 that retains the blades and stores an upper half portion of the two blades 20. A space that opens upward between the blades 20 at an upper portion of the connecting body 10 is formed as a receiving part 11 for receiving a mating part of the mating connector 2 from above, as described later.

As seen in FIG. 3(B), the blade 20 has: a plurality of strip sheet-shaped terminals 30 arranged at equal intervals in a connector width direction (direction matching a width direction of the blade 20) orthogonal to an arrangement direction of the connecting body 10; two types of retaining bodies 40, 50 ("upper retaining body 40" and "lower retaining body 50" described later) made of an electrical insulating material such as a resin or the like, which retains the plurality of terminals 30; and three types of ground plates 60, 70, 80 as ground members ("upper outward side ground plate 60", "upper inward side ground plate 70", and "lower ground plate 80" described later) arranged on one surface plate side (corresponding to an "inward side" described later) or the other surface plate side (corresponding to an "outward side" described later) of the plurality of terminals 30, and retained by the retaining bodies 40, 50. Hereinafter, for the two blades 20 forming a pair, the surface facing each other is referred to as "inward side" and the opposite side is referred to as "outward side".

As seen in FIG. 3(B), a plurality of terminals 30 are made of signal terminals 30S and ground terminals 30G. In the blades 20, the terminals 30 are arranged so that the ground terminals 30G are positioned to sandwich two adjacent signal terminals 30S. In the present embodiment, the two adjacent signal terminals 30S are made to transmit a mutually paired high-speed differential signal. Hereinafter, the signal terminals 30S and the ground terminals 30G will be described as a "terminal 30" when distinguishing between the two is not required.

A terminal 30 is made with a strip-shaped metal member extending in a connector mating direction, in other words, a vertical direction, is partially bent, and arranged so that the plate surface is orthogonal to the arrangement direction of the connecting body 10. The terminal 30 has an elastic arm part 31 extending upward from the upper retaining body 40 described later, a connecting part 32 protruding downward from the lower end of the lower retaining body 50 described later, and a retained part 33 (refer to FIG. 6(A)) that connects the elastic arm part 31 that extends in the vertical direction and the connecting part 32 and that is retained by integral molding by the retaining bodies 40, 50. Hereinafter, the parts of terminal 30 are described with an "S" or "G" attached to the reference code for the parts if it is necessary to distinguish between the signal terminal 30S and the ground terminal 30G.

The elastic arm part 31 can be elastically displaced in a plate thickness direction. On an upper end side of the elastic arm part 31, a contacting part 31A that is bent so as to protrude toward an inward side in the plate thickness direction is formed, and the contacting part 31A is made so as to elastically contact a terminal 110 ("mating terminal 110" described later) of the mating connector 2. As described above, the connecting part 32 protrudes downward from the lower end of the lower retaining body 50, and is soldered and connected to a corresponding circuit part of the circuit board P1 by a solder ball B1 (refer to FIGS. 1, 2).

Figure 6A:
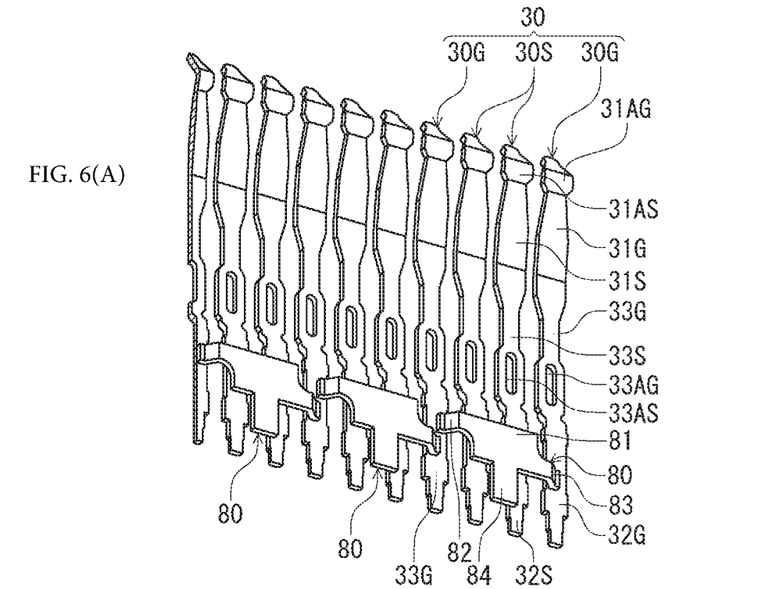
FIG. 6(A) is a cross-sectional perspective view illustrating the terminal and lower ground plate.
Figure 6B:
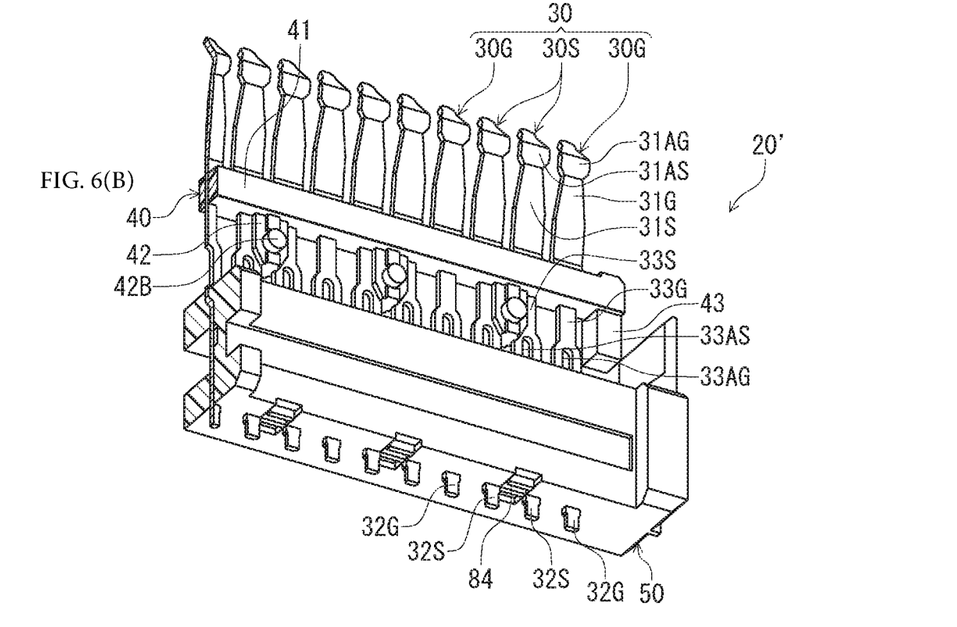
FIG. 6(B) is a cross-sectional perspective view illustrating a condition wherein the terminal and lower ground plate in FIG. 6(A) are retained by a retaining body.

As seen in FIG. 6(B), the upper end portion of the retained part 33 is retained by the upper retaining body 40, and the lower half portion is retained by the lower retaining body 50. Furthermore, a retained part 33S of the signal terminal 30S is retained by the upper end portion as well as by an upper retaining body 40 in a range positioned directly above a hole part 33A (33AS) described later. In the retained part 33, the hole part 33A that extends in the vertical direction in a central region in a terminal width direction is formed passing through within a range between the upper end portion and the lower half portion, in other words, a range not retained by the upper retaining body 40 or the lower retaining body 50.

As seen in FIG. 6(B), the upper retaining body 40 has a main retaining part 41 that extends over the terminal arrangement range in the terminal arrangement direction, a sub-retaining part 42 that protrudes downward from the main retaining part 41 at a position corresponding to the area between adjacent signal terminals 30S, and an end protruding portion 43 that protrudes downward at the end portion in the terminal arrangement direction of the main retaining part 41.

The main retaining part 41 extends over a range including the terminal arrangement range in the terminal arrangement direction, and embeds and retains the upper portion of the retained part 33 of all the terminals 30 so as to cover all surfaces of the upper portion. The sub-retaining part 42 has a plate surface parallel to the plate surface of the terminal 30 and is a plate shape extending in the vertical direction, and in the terminal arrangement direction, is positioned in a range including an opposite edge portion (side edge portion that extends in the vertical direction) of the retained part 33S of two adjacent signal terminals 30S. The plate thickness dimension of the sub retaining part 42 is larger than the plate thickness dimension of the terminal 30, and retains the opposite edge portion so as to cover both plate surfaces and the opposite end surface (plate thickness surface) of the opposite edge portion of the two signal terminals 30S. Furthermore, the sub-retaining part 42 has a cylindrical retaining protrusion 42A that protrudes from both plate surfaces, and retains the two ground plates 60, 70 by the retaining protrusion 42A as described later. As seen in FIG. 6(B), the end protruding portion 43 extends downward in a prismatic shape at a position outside the terminal arrangement range.

The lower retaining body 50 extends over a range including the terminal arrangement range in the terminal arrangement direction, and embeds and retains the lower half portion of the retained part 33 of all the terminals 30. As seen in FIGS. 3(A) and 3(B), in the lower retaining body 50, a recessed portion 51 extending over the terminal arrangement range at an intermediate position in the vertical direction is formed by being sunk into the outward side surface (wall surface on the near side in FIGS. 3(A) and 3(B)) of the lower retaining body 50. The recessed portion 51 is sunk in up to the position of the outward side surface (plate surface) of the retained part 33 of the terminal 30, and the outward side surface (plate surface) of the retained part 33 is exposed in the recessed portion 51. Furthermore, on the inward side surface (wall surface on the near side in FIG. 4(A)) of the lower retaining body 50, a positioning portion 52 protruding from the inward side surface is formed on an end portion and intermediate portion in the terminal arrangement direction. As seen in FIGS. 3(A) and 3(B), the positioning portion 52 positions the mutually paired, opposing blades 20 in opposing directions (arrangement direction of the connecting body 10). In other words, the mutually paired blades 20 are positioned by the positioning portions 52 of the lower retaining body 50 of the blades 20 being in contact on the protruding top surface. Furthermore, a receiving part 11 is formed between the upper portions of the positioned blades 20.

On a bottom surface of the lower retaining body 50, between the signal terminals 30S in the terminal arrangement direction, a bottom recessed portion 53 that is sunk in from the bottom surface and opened inward in the arrangement direction of the connecting body 10 is formed at a position closer to an inward side in an opposing direction of the blades 20. As seen in FIGS. 3(A) and 3(B), a detecting part 84 of a lower ground plate 80 described later is accommodated in the bottom recessed portion 53.

In the blades 20 of the present embodiment, as seen in FIG. 3(B), three types of ground plates, specifically, one upper outward side ground plate 60, one upper inward side ground plate 70, and a plurality of lower ground plates 80 are provided. The upper outward side ground plate 60 is provided facing an outward side surface of the retained part 33 of all terminals 30 in the range between the main retaining part 41 of the upper retaining body 40 and the lower retaining part 50 in the vertical direction. The upper inward side ground plate 70 is provided facing an inward side surface of the retained part 33 of all terminals 30 in the vertical direction in the same range as the upper outward side ground plate 60 (refer to FIG. 4(B)). Furthermore, the lower ground plate 80 is extended in the terminal arrangement direction in a range corresponding to four terminals 30 at a lower position than the upper inward side ground plate 70, and is provided facing an inward side surface of a lower half portion of the retained part 33 of the terminals 30 (refer to FIG. 4(B)).

Figure 5A:
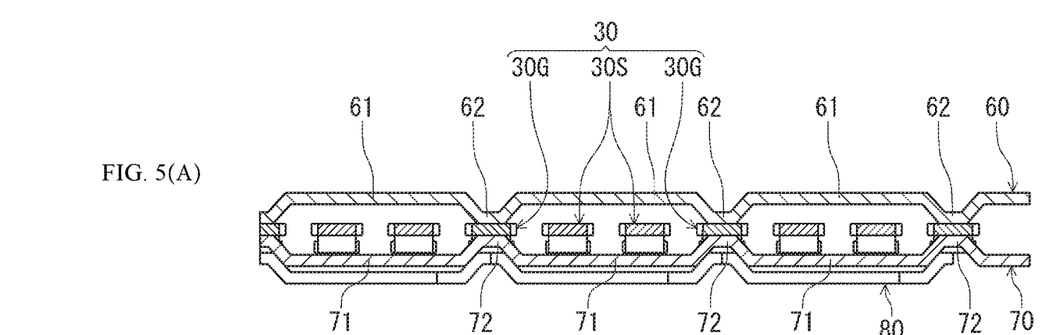
FIG. 5(A) to 5(c) are cross-sectional views of FIG. 4 (B)

As seen in FIG. 3(B), the upper outward side ground plate 60 extends in the terminal arrangement direction over an entire terminal arrangement range, and is made by bending a metal plate member in the plate thickness direction. The upper outward side ground plate 60 has a square flat plate part 61 positioned corresponding to two adjacent signal terminals 30S, and a ridge portion 62 at a position corresponding to the ground terminals 30G that protrudes toward the outward side surface (plate surface) of the ground terminals 30G and that extends in the vertical direction. As seen in FIG. 5(A), the ridge portion 62 is in contact with the outward side surface of the ground terminals 30G at a flat protruding top portion. Furthermore, the upper outward side ground plate 60 has a circular hole part (not illustrated) formed passing through at a position corresponding to the retaining protrusion 42A on an outward side of the upper retaining body 40, and the upper retaining body 40 is retained by the retaining protrusion 42A in a condition wherein the retaining protrusion 42A is inserted into the hole part and ultrasonic welding is performed. FIG. 3(B) illustrates a condition wherein a tip of the retaining protrusion 42A is melted and deformed by the ultrasonic welding.

The upper inward side ground plate 70 has the same shape as the upper outward side ground plate 60, and is arranged on an opposite side of the upper outward side ground plate 60, in other words, on an inward side of the blade 20. Similar to the upper outward side ground plate 60, the upper inward side ground plate 70 also has a flat plate part 71 positioned corresponding to two adjacent signal terminals 30S, and a ridge portion 72 at a position corresponding to the ground terminals 30G and that is in contact with the inward side surface (plate surface) of the ground terminals 30G (refer to FIG. 5(A)). Furthermore, the upper inward side ground plate 70 is retained by the upper retaining body 40 on the inward side of the blade 20 by performing ultrasonic welding in a condition where a retaining protrusion 42B (refer to FIG. 6(B)) on the inward side of the upper retaining body 40 is inserted into a hole part 71A (refer to FIG. 4(B)) formed on the flat plate part 71.

As seen in FIG. 5(A), the pairs of two adjacent signal terminals 30S are surrounded by the ground plates 60, 70 and two ground terminals 30G in the vertical direction and are shielded from the outside. As a result, crosstalk between the pairs can be reliably prevented, and a signal can be reliably transmitted without being affected by external noise.

Figure 4A:
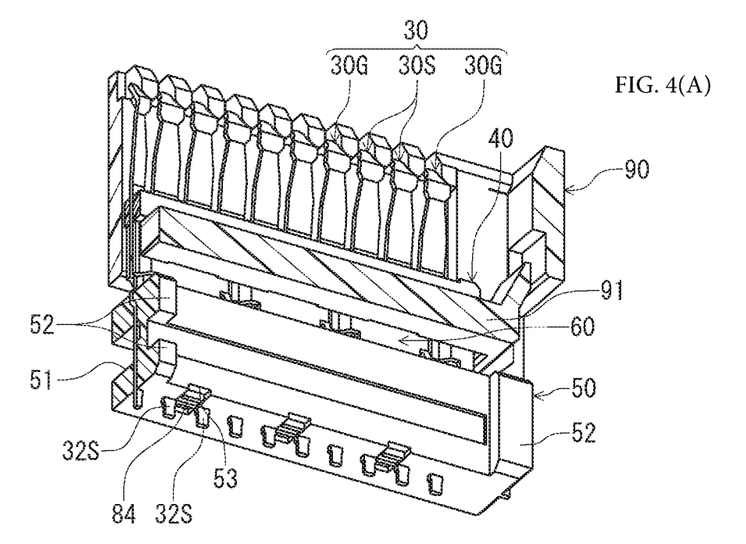
FIG. 4(A) is a cross-sectional perspective view of a cross-section in a direction orthogonal to a blade arrangement direction of the connecting body in FIG. 3(A)
Figure 4B:
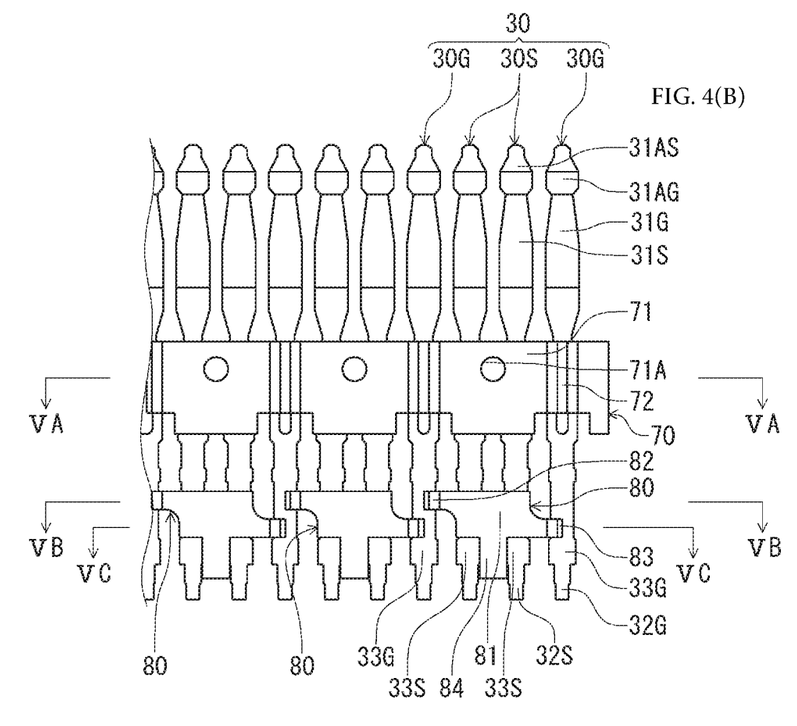
FIG. 4(B) is a front view of the connecting body illustrated in FIG. 4(A) wherein the housing and retaining body are omitted from the connecting body.

As seen in FIG. 4(B) or FIG. 6(A), a plurality of the lower ground plates 80 are arranged in the terminal arrangement direction. The lower ground plate 80 is made by bending a metal plate member in the plate thickness direction, and is arranged corresponding to a terminal group consisting of a total of four terminals 30, namely, two adjacent signal terminals 30S and two ground terminals 30G that are positioned sandwiching the two adjacent signal terminals 30S.

The lower ground plate 80 has: a square flat plate part 81 at a position corresponding to two signal terminals 30S, an upper contact piece 82 that extends left from an upper portion of a first side edge (side edge on a left side in FIG. 4(B)) of the flat plate part 81, a lower contact piece 83 that extends right from a lower portion of a second side edge (side edge on a right side in FIG. 4 (B)) of the flat plate part 81, and a detecting part 84 that extends downward from a low edge of the flat plate part 81 in a central region in a terminal arrangement direction of the flat plate part 81. The lower ground plate 80 is retained on an inward side of the lower retaining body 50 by being integrally molded and buried with the terminals 30 by the lower retaining body 50.

Figure 5B:
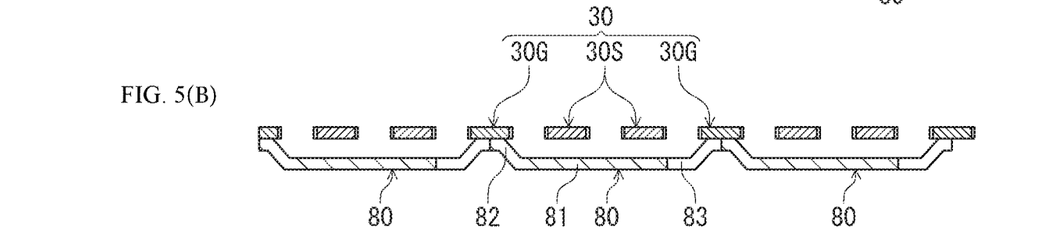
Figure 5C:
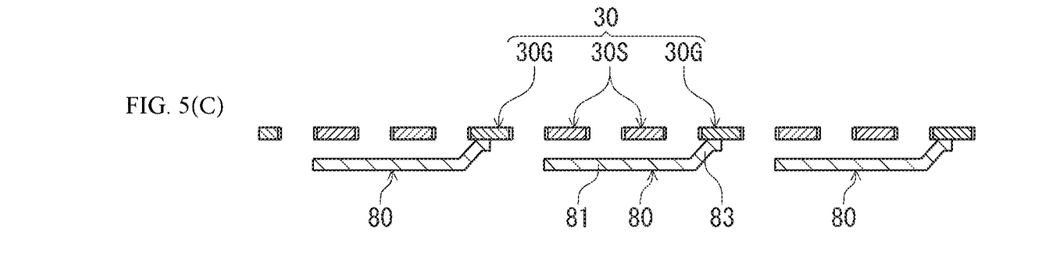

As seen in FIG. 6(A), the upper contact piece 82 and the lower contact piece 83 are bent at a side edge of the flat plate part 81, and are slanted and extended so as to get closer to the inward side surface (plate surface on the near side in FIG. 6(A)) of the corresponding ground terminals 30G. Furthermore, the contact pieces 82, 83 that are slanted and extended are bent so that the tip end portions are facing toward the terminal arrangement direction, in other words, parallel to the inward side surface of the ground terminals 30G, and are in contact with the inward side surface of the retained part 33G of the ground terminals 30G at a flat plate surface of the tip end portions (refer to FIGS. 5(B) and 5(C)). As seen in FIG. 4(B) and FIG. 6(A), the ground terminals 30G (ground terminals 30G other than the ground terminals 30G at the outermost position) arranged at an intermediate position in a terminal arrangement range are in contact with the upper contact piece 82 of the first lower ground plate 80 and the lower contact piece 83 of the second lower ground plate 80 of the two adjacent lower ground plates 80. Furthermore, either the upper contact piece 82 or the lower contact piece 83 of the ground terminals 30G is in contact with the ground terminals 30G at the aforementioned outermost position.

The detecting part 84 is extended downward at a position corresponding to the area between two adjacent signal terminals 30S, and, as seen in FIG. 4(A), the lower end of the detecting part 84 is almost at the same position as the bottom surface of the lower retaining body 50 in a vertical direction. As seen in FIG. 4(A), the lower end portion of the detecting part 84 is protruded from the upward inner wall surface of the bottom recessed portion 53 of the lower retaining body 50 and exposed, and is positioned in the bottom recessed portion 53.

In the present embodiment, the lower ground plate 80 is positioned on the inward side of the lower retaining body 50 in a condition contacting two ground terminals 30G in order to be firmly retained by the lower retaining body 50, and is reliably in contact with the ground terminals 30G. Furthermore, the lower ground plate 80 firmly retained by the lower retaining body 50 is less likely to be displaced, and as a result, the initial contact condition of the lower ground plate 80 and the ground terminals 30G is maintained.

Furthermore, in the present embodiment, a plurality of lower ground plates 80 that extend over the arrangement range of four terminals 30 are provided, and the lower ground plates 80 are smaller in the terminal arrangement direction, compared to when one lower ground plate 80 that extends over the entire terminal arrangement range is provided, and therefore, retaining the lower ground plate 80 becomes more reliable. Furthermore, even if the total number of the terminals 30 and therefore the number of ground terminals 30G is increased or reduced due to a design change of the connector, adjustment is easy by accordingly increasing or reducing the number of the lower ground plates 80.

The housing 90 is made from an electrical insulating material such as a resin or the like, and is a square tubular member having a rectangular parallelepiped outer shape with a terminal arrangement direction in a longitudinal direction. As seen in FIG. 3(A), the housing 90 accommodates a pair of blades 20 in a space passing through in a vertical direction, and has an intermediate wall 91 extending in the terminal arrangement direction between the blades 20 on a lower portion of the housing 90. The housing 90 is attached to the pair of blades 20 from above and accommodates the upper half portion of the blades 20, as seen in FIG. 3(A).

Next, a manufacturing process of the connector 1 will be described. Furthermore, a test procedure for detecting the electrical conduction condition between the terminal 30 and lower ground plate 80, performed in conjunction with the manufacturing process, will also be described.

First, as seen in FIG. 6(A), a plurality of the terminals 30 are arranged at a predetermined interval, and a plurality of the ground plates 80 are arranged such that the upper contact piece 82 and lower contact piece 83 of the lower ground plate 80 respectively contact a plate surface of a corresponding ground terminal 30 in one metal mold (not illustrated in the drawing) for simultaneously molding the retaining bodies 40, 50. At this time, the elastic arm part 31 and connecting part 32 of the terminal 30 are positioned outside of the metal mold. Furthermore, the plurality of terminals 30 and the plurality of lower ground plates 80 may respectively be connected to a carrier.

Next, the retaining bodies 40, 50 are molded such that the lower ground plate 80 and retained part 33 of the terminal 30 are integrally retained by the retaining bodies 40, 50 (refer to FIG. 6(B)). Specifically, by injecting and solidifying melted resin in the metal mold, an upper end portion of the retained part 33 of the terminal 30 is retained by the upper retaining body 40, and the lower ground plate 80 (excluding the detecting part 84) and the lower half portion of the retained part 33 of the terminal 30 are retained by the lower retaining body 50, and thus a semi-finished product 20' of the blade 20 as seen in FIG. 6(B) is obtained.

In the present embodiment, the retaining bodies 40, 50 are simultaneously molded in one metal mold, but, in addition, the retaining bodies 40, 50 may also be separately molded in a metal mold. If molding in a separate metal mold, the molding process of the lower retaining body 50 must be performed first or simultaneously with the molding process of the upper retaining body 40 in order to perform a test described later.

Figure 7:
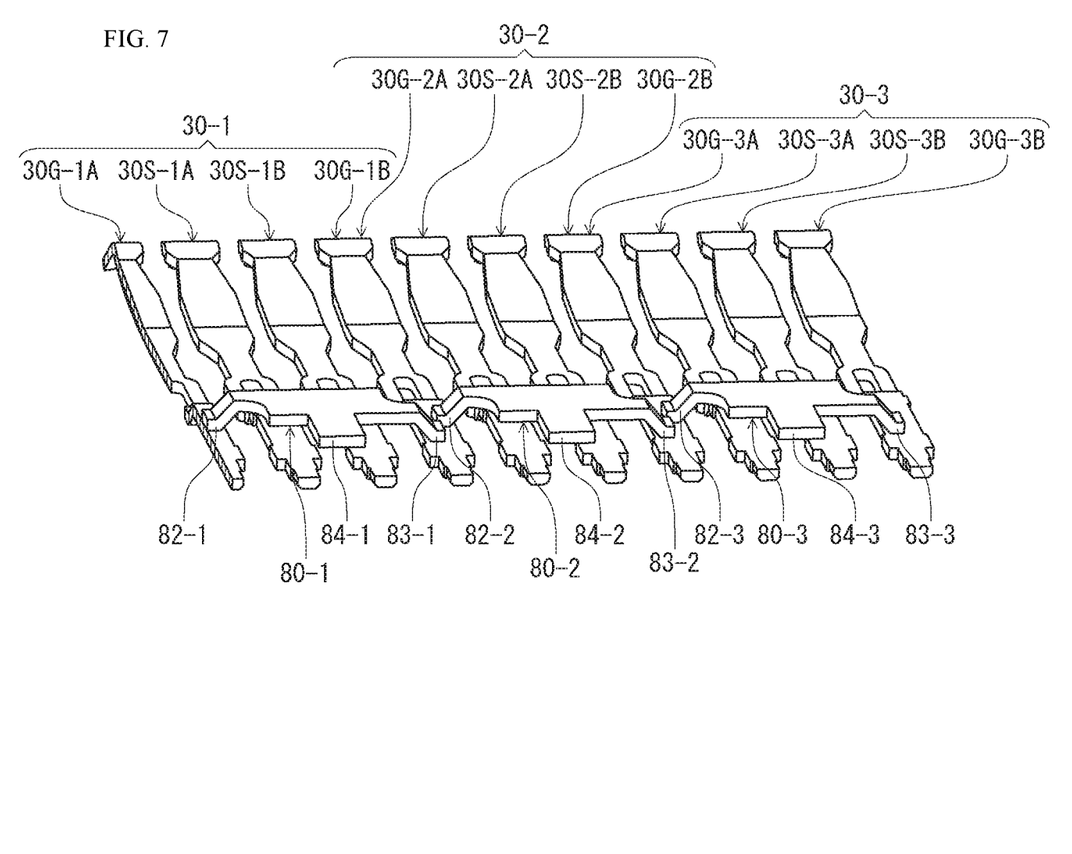
FIG. 7 is a diagram describing the test of the electrical connector.

Next, a test for confirming the electrical conduction condition between the lower ground plates 80 and the ground terminals 30G (hereinafter, referred to as "continuity test") is performed before attaching the upper outward side ground plate 60 and upper inward side ground plate 70 to the semi-finished product 20'. FIG. 7 is a diagram for describing the test, which illustrates only the terminals 30 and lower ground plates 80 while omitting the illustration of the retaining bodies 40, 50 from the semi-finished product 20' of the blade 20. FIG. 7 illustrates three terminal groups (first terminal group 30-1, second terminal group 30-2, and third terminal group 30-3) each consisting of a total of four terminals 30, namely, two signal terminals 30S forming an adjacent pair and two ground terminals 30G respectively positioned on each side of the signal terminals 30S. Furthermore, FIG. 7 illustrates a condition where lower ground plates 80-1, 80-2, 80-3 are positioned corresponding to the terminal groups 30-1, 30-2, 30-3.

As seen in FIG. 7, the first terminal group 30-1 has ground terminal 30G-1A, signal terminal 30S-1A, signal terminal 30S-1B, and ground terminal 30G-1B arranged in order from the left. The second terminal group 30-2 has ground terminal 30G-2A, signal terminal 30S-2A, signal terminal 30S-2B, and ground terminal 30G-2B arranged in order from the left. The third terminal group 30-3 has ground terminal 30G-3A, signal terminal 30S-3A, signal terminal 30S-3B, and ground terminal 30G-3B arranged in order from the left. Herein, each ground terminal 30G belongs to both of the two adjacent terminal groups with the exception of the ground terminal 30G positioned on an outermost end of the terminal arrangement range. In other words, in FIG. 7, the ground terminal 30G-1B on the right side of the first terminal group 30-1 and the ground terminal 30G-2A on the left side of the second terminal group 30-2 are the same ground terminal 30G, and the ground terminal 30G-2B on the right side of the second terminal group 30-2 and the ground terminal 30G-3A on the left side of the third terminal group 30-3 are the same ground terminal 30G.

A procedure of the continuity test will be described below. First, a voltage is applied on the ground terminal 30G-1A of the first terminal group 30-1 and a detecting part 84-1 of the lower ground plate 80-1 to detect the presence or absence of a current. As a result, if a current is detected, it is confirmed that the ground terminal 30G-1A and a contact piece 82-1 of the lower ground plate 80-1 are in contact and in an electrically conducting condition. On the other hand, if a current is not detected, it is confirmed that the ground terminal 30G-1A and contact piece 82-1 of the lower ground plate 80-1 are not electrically conducting, in other words, both are in a contact failure condition.

Next, a voltage is applied on the ground terminal 30G-1B of the first terminal group 30-1 and detecting part 84-1 of the lower ground plate 80-1 to inspect the electrical conduction condition between both, using the same procedure as the continuity test between the ground terminal 30G and lower ground plate 80-1. The continuity test is performed twice in this manner, and thus a continuity test between the lower ground plate 80-1 and the ground terminals 30G-1A, 30G-1B of the first terminal group 30-1 is completed.

Similar to the continuity test for the first terminal group 30-1, a continuity test between the ground terminals 30G-2A, 30G-2B of the second terminal group 30-2 and the lower ground plate 80-2 is performed for the second terminal group 30-2, and a continuity test between the ground terminals 30G-3A, 30G-3B of the third terminal group 30-3 and the lower ground plate 80-3 is performed for the third terminal group 30-3. Herein, a continuity test for the three terminal groups illustrated in FIG. 7 is described, but in actuality, a continuity test can be performed for all terminal groups, including terminal groups not illustrated in the drawings.

In the present embodiment, a continuity test is performed by a current flowing in a portion exposed from the lower retaining body 50 on a ground terminal 30G and a lower ground plate 80, in other words, the connecting part 32G of the ground terminal 30G and detecting part 84 of the lower ground plate 80, and therefore, the electrical conduction condition between the ground terminal 30G and the lower ground plate 80 can be easily confirmed. Furthermore, in the present embodiment, the connecting part 32G and detecting part 84 are protruding from the lower retaining body 50 in the same direction, and therefore, a continuity test is made easier.

As a result of performing the aforementioned continuity test for all of the terminal groups, if contact failure between a ground terminal 30G and a lower ground plate 80 is detected in at least one of the terminal groups, the semi-finished product 20' will be treated as a defective product and will not be used in manufacturing the connector 1 or the contact condition will be further improved.

On the other hand, as a result of the continuity test, if, in the semi-finished product 20', the electrical conduction condition between the ground terminal 30G and lower ground plate 80 are detected for all of the terminal groups, the upper outward side ground plate 60 and upper inward side ground plate 70 are attached to the upper retaining body 40 by the aforementioned ultrasonic welding, and then the terminal 30 and lower ground plate are separated from the carrier to complete the blade 20.

Next, the two s are attached to the housing 90 by press-fitting from below in a state in which the inward side surfaces are mutually facing to complete the connecting body 10. Furthermore, the plurality of connecting bodies 10 are attached to a supporting body (not illustrated in the drawings) such that the plurality of connecting bodies 10 are collectively supported by the supporting body, and thus the connector 1 is completed. The supporting body can be configured, for example, from a pair of metal plate members extending in an arrangement direction of the connecting body 10 at a position on both ends of the connecting body 10 in a terminal arrangement direction.

In the present embodiment, the continuity test is only performed on the lower ground plate 80, prior to attaching the ground plates 60, 70 to the upper retaining body 40, and is not performed on the ground plates 60, 70. This is because even if attempting to perform a continuity test on the ground plates 60, 70, the lower ground plate 80 is already attached and in a condition contacting the ground terminal 30G, and therefore, it is not possible to confirm the electrical conduction condition between the ground plates 60, 70 and ground terminal 30G. Thus, even if different types of ground members are provided on the blade, the continuity test can be performed only on one type of ground member. Therefore, the continuity test is preferably performed on the one type of ground member which is most important from the perspective of ensuring favorable signal transmission properties. For example, in the ground terminal 30G of the connector 1 according to the present embodiment, whether or not the lower ground plate 80 is reliably contacting on a lower half portion of the retained part 33G positioned near the connecting part 32G of the ground terminal 30G largely affects the signal transmission properties, in relation to the frequency band range of a signal transmitted in the connector 1, and therefore, of the three types of ground plates 60, 70, 80, the continuity test is performed on the lower ground plate 80.

As another example, even if the connector 1 is used in transmitting another signal in a different frequency band than the aforementioned frequency band, it may be of paramount importance that the terminal 30 reliably contacts, for example, the upper outward side ground plate 60 on the upper half portion of the retained part 33 from the perspective of ensuring favorable signal transmission properties. In this case, first, after the upper outward side ground plate 60 is attached to the upper retaining body 40 prior to the ground plates 70, 80, a continuity test can be performed between the ground terminal 30G and the detecting part formed on a portion exposing the upper outward side ground plate 60. Furthermore, if contact with the upper inward side ground plate 70 is of paramount importance, similarly, after the upper inward side ground plate 70 is attached prior to attaching the ground plates 60, 80, a continuity test can be performed between the ground terminal 30G and the detecting part formed on a portion exposing the upper inward side ground plate 70.

Various changes are possible for the number, shape, and the like of the ground plate. In the present embodiment, three ground plates 60, 70, 80 that are not directly mutually connected are provided, but instead, the ground plates 60, 70 may be directly connected or the upper inward side ground plate 70 and lower ground plate 80 may be directly connected, for example. Furthermore, a ground plate forming the same shape as the lower ground plate 80 provided on an inward side of the blade 20 may be provided below the upper outward side ground plate 60 on an outward side of the blade 20, or the ground plate may be directly connected to the upper outward side ground plate 60 or lower ground plate 80.

Next, a configuration of the mating connector 2 will be described based on FIG. 1 and FIG. 2. As seen in FIG. 1, in the present embodiment, the same number of mating connectors 2 as the connecting body 10 are arranged at equal intervals in the same direction as an arrangement direction of the connecting body 10. As seen in FIG. 1, the mating connector 2 has a housing 100 made of an electrical insulating material such as a resin or the like extending in a connector width direction (same direction as the connector width direction of the connector 1) as a longitudinal direction, and a plurality of terminals 110 (hereinafter, referred to as "mating terminal 110") arranged and retained in a connector width direction by the housing 100.

A mating terminal 110 is formed by punching a metal plate member in a thickness direction, having an overall shape that forms a strip shape extending in a vertical direction, and, as seen in FIGS. 1, 2, is press-fit retained by the housing 100, in a condition arranged in a connector width direction. The retention form of the mating terminals 110 by the housing 100 is not limited to press-fit retaining, and may be retained by integral molding, for example. The plurality of the mating terminals 110 are used as signal terminals 110S (hereinafter, referred to as "mating signal terminal 110S") or ground terminals 110G (hereinafter, referred to as "mating ground terminal 110G"). In the present embodiment, the mating terminals 110 are arranged corresponding to an arrangement of the signal terminals 30S and ground terminals 30G provided on the blades 20 of the connector 1.

The mating terminal 110 is provided on both wall surface sides (surfaces orthogonal to an arrangement direction of the mating connector 2) of the housing 100 and provided while forming two rows symmetrical to the housing 100 in a wall thickness direction (arrangement direction of the mating connector 2) of the housing 100. The mating terminal 110 has an exposed mating contacting part 111 extending along the wall surface of the housing 100 and a connecting part 112 protruding from the housing 100 on an upper end side.

The mating contacting part 111 contacts a contacting part 31A (refer to FIG. 3(B) and the like) of the terminal 30 of the connector 1 on a plate surface exposed from the housing 100. Specifically, the mating contacting part 111S of the mating signal terminal 110S contacts a contacting part 31AS of the signal terminal 30S and the mating contacting part 111G of the mating ground terminal 110G contacts a contacting part 31AG of the ground terminal 30G. Furthermore, as seen in FIG. 1, the connecting part 112 protrudes upward from the housing 100 and a solder ball B2 is attached. The connecting part 112 can be solder-connected to a corresponding circuit part (not illustrated in the drawings) of the circuit board P2.

Next, a connector mating operation between the connector 1 and mating connector 2 will be described based on FIGS. 1 and 2. First, a connector 1 is mounted by solder-connecting to the circuit board P1, and the same number of connectors 2 as the connecting body 10 of the connector 1 are mounted by solder-connecting to the circuit board P2. Next, as seen in FIG. 1, the mating connector 2 is positioned above the connector 1, such that the mating connector 2 faces downward and the mating connectors 2 correspond to the receiving parts 11 of the connecting bodies 10 of the connectors 1.

Next, the mating connector 2 is moved downward, and, as seen in FIG. 2, the mating connectors 2 are mated to the corresponding connecting bodies 10 from above, and thus the connector mating operation is completed. At this time, the mating part of the mating connector 2 enters the receiving part 11 of the connecting body 10. When mating between the connector 1 and mating connector 2 is completed, the contacting part 31A of the terminal 30 provided on the blade 20 of the connecting body 10 contacts the mating contacting part 111 of the mating terminal 110 provided on the mating connector 2 with direct voltage to conduct electricity. Specifically, the contacting part 31AS of the signal terminal 30S contacts the mating contacting part 111S of the mating signal terminal 110S, and the contacting part 31AG of the ground terminal 30G contacts the mating contacting part 111G of the mating ground terminal 110G.

Second Embodiment

In the first embodiment, a plurality of the lower ground plates 80 are provided, and each of the lower ground plates 80 contact the ground terminals 30G of a corresponding terminal group so as to be electrically conducted, but the present embodiment differs from the first embodiment in that a single lower ground plate corresponding to all terminal groups is provided. Configurations other than the lower ground plate in the present embodiment are the same as the first embodiment, and therefore, descriptions are omitted.

Figure 8:
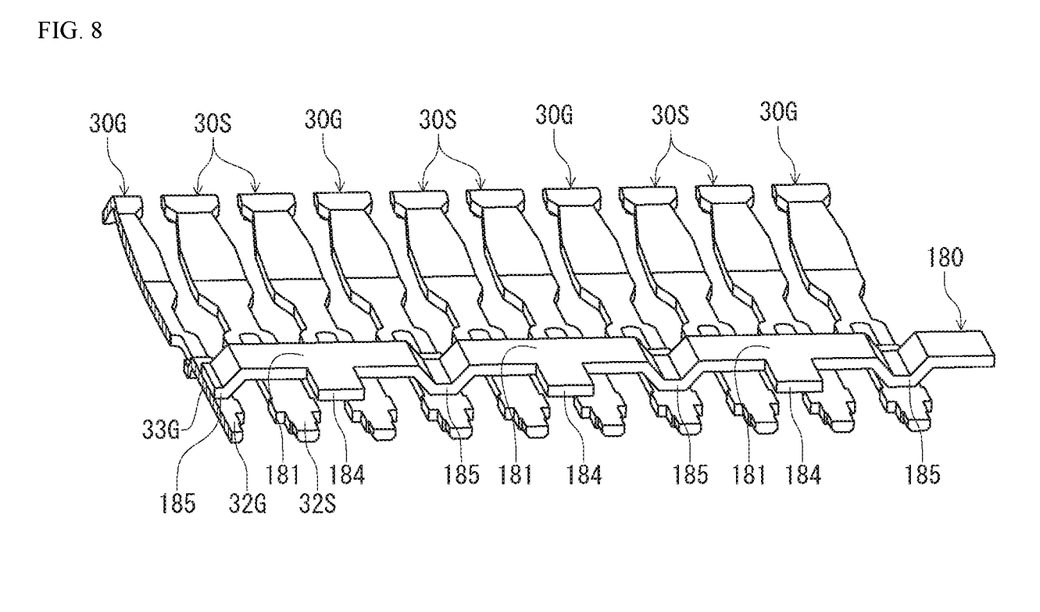
FIG. 8 is a diagram illustrating an electrical connector terminal and a lower ground plate according to the second embodiment.

FIG. 8 is a diagram illustrating terminals 30 and the lower ground plate 180 of a connector according to the second embodiment. The lower ground plate 180 in the present embodiment is prepared by partially bending in a plate thickness direction a metal plate member extending in a terminal arrangement direction. Specifically, the lower ground plate 180 extends over a range including all of the terminals 30, and includes a square flat plate part 181 positioned corresponding to two adjacent signal terminals 30S, a contact protruding part 185 protruding toward a plate surface of a retained part 33G of the ground terminal 30G at a position corresponding to the ground terminal 30G, and a detecting part 184 extending downward (front side in FIG. 8) from the flat plate part 181. The contact protruding part 185 contacts a plate surface of the retained part 33G of the ground terminal 30G on a protruding top surface thereof (flat plate surface). Furthermore, the lower ground plate 180 and retained part 33 of the terminal 30 are retained by integral molding by a lower retaining body (not illustrated in the drawing) similar to the first embodiment, and thus a mutually contacting condition is maintained. Furthermore, the detecting part 184 of the lower ground plate 180 and connecting part 32 of the terminals 30 protrude from the lower retaining body.

A continuity test in the present embodiment is performed by applying a voltage on the connecting part 32G of one ground terminal 30G and an arbitrary detecting part 184 of the lower ground plate 180 to detect the presence or absence of a current. The continuity test is performed sequentially for all of the ground terminals 30G. According to the present embodiment, the lower ground plate 180 is provided as a single member contacting all of the ground terminals 30G, and therefore, a continuity test between all of the ground terminals 30G can be performed using only a specific detecting part 184 selected in advance, thereby simplifying the continuity test. However, using the same detecting part 184 is not required in all continuity tests, and it goes without saying that a different detecting part 184 may be selected for each continuity test.

In the first and second embodiments, the detecting parts 84, 184 of the lower ground plates 80, 180 are formed as a portion protruding downward from the lower retaining body 50, but the form of the detecting part is not limited thereto, and various modifications are possible. For example, a portion of the flat plate parts 81, 181 of the lower ground plates 80, 180 may be exposed from an outer wall surface of the lower ground plate 80, 180, and the exposed portion may be used as a detecting part.

In the first and second embodiments, a ground member having a detecting part was a ground plate as a metal plate member, but the ground member is not required to be a plate.

DESCRIPTION OF THE REFERENCE CODES

1 Connector
30 Terminal
30S Signal terminal
30G Ground terminal
32, 32S, 32G Connecting part
50 Lower retaining body (retaining body)
80, 180 Lower ground plate (ground member)
84, 184 Detecting part
P1 Circuit board (Mating connecting member)

The invention claimed is:
1. An electrical connector, comprising:
  a plurality of terminals comprising a plurality of signal terminals and a plurality of ground terminals;
  a retaining body, made of an insulating material, that arranges and retains the plurality of terminals in a condition where the plurality of signal terminals and the plurality of ground terminals are intermingled;
  a ground member retained by the retaining body on an inward side of the retaining body in an electrical conduction condition between the ground member and at least two of the plurality of ground terminals;
  at least one or more additional ground members, wherein each of the at least one or more additional ground members contacts different combinations of the plurality of ground terminals;
  wherein the ground member has a detecting part exposed from the retaining body in order to detect the electrical conduction condition between the at least two of the ground terminals and the ground member, the ground member molded with the plurality of terminals;
  wherein each of the plurality of terminals have on one end a connecting part for connecting with a mating connecting member, and
  wherein the connecting part of the plurality of terminals and the detecting part of the ground member protrude from the retaining body in a same direction.

2. A test method of an electrical connector for detecting an electrical conduction condition between a ground terminal and a ground member of the electrical connector, such that the electrical connector is comprised by:
- a plurality of terminals comprising a plurality of signal terminals and a plurality of ground terminals;
- a retaining body, made of an insulating material, that arranges and retains the plurality of terminals in a condition where the plurality of signal terminals and the plurality of ground terminals are intermingled;
- a ground member retained by the retaining body on an inward side of the retaining body in an electrical conduction condition between the ground member and a ground terminal of the plurality of ground terminals the ground member molded with the plurality of terminals; and
- at least one or more additional ground members, wherein each of the at least one or more additional ground members contacts different combinations of the plurality of ground terminals;

wherein the test method of the electrical connector comprises:
- providing an electrical current to flow to a detecting part formed on the ground member and exposed from the retaining body and the ground terminal of the plurality of ground terminals to detect the electrical conduction condition between the ground member and the predetermined ground terminal,
- wherein each of the plurality of terminals have on one end a connecting part for connecting with a mating connecting member, and wherein the connecting part of the plurality of terminals and the detecting part of the ground member protrude from the retaining body in a same direction.

* * * * *